United States Patent
Matsumura et al.

(10) Patent No.: US 7,635,601 B2
(45) Date of Patent: Dec. 22, 2009

(54) METHOD OF MANUFACTURING SEMICONDUCTOR DEVICE AND CLEANING APPARATUS

(75) Inventors: Tsuyoshi Matsumura, Hiratsuka (JP); Yoshihiro Uozumi, Yokohama (JP); Kunihiro Miyazaki, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 406 days.

(21) Appl. No.: 11/520,589

(22) Filed: Sep. 14, 2006

(65) Prior Publication Data
US 2007/0178613 A1 Aug. 2, 2007

(30) Foreign Application Priority Data
Jan. 30, 2006 (JP) .............................. 2006-021024

(51) Int. Cl.
*H01L 21/66* (2006.01)
(52) U.S. Cl. .......................... 438/17; 438/43; 438/638; 438/639; 438/640; 257/774; 257/E21.218; 257/E21.219; 257/E21.224
(58) Field of Classification Search ................... 438/17, 438/43, 638, 639, 640, 735, 738; 257/774, 257/E21.218, E21.219, E21.224; 510/466
See application file for complete search history.

(56) References Cited

U.S. PATENT DOCUMENTS

| | | | |
|---|---|---|---|
| 5,650,041 A * | 7/1997 | Gotoh et al. ................. 438/618 |
| 6,080,529 A * | 6/2000 | Ye et al. ...................... 430/318 |
| 6,194,326 B1 * | 2/2001 | Gilton .......................... 438/745 |
| 2004/0035448 A1 * | 2/2004 | Aegerter et al. ............... 134/33 |
| 2004/0082491 A1 * | 4/2004 | Olson et al. .................. 510/375 |
| 2004/0137736 A1 * | 7/2004 | Daviot et al. ................. 438/690 |

FOREIGN PATENT DOCUMENTS

| | | |
|---|---|---|
| JP | 07-193045 | 7/1995 |
| JP | 2001308063 | * 11/2001 |
| JP | 2003-151950 | * 2/2003 |
| JP | 2003-151950 | 5/2003 |

* cited by examiner

*Primary Examiner*—A. Sefer
*Assistant Examiner*—Farid Khan
(74) *Attorney, Agent, or Firm*—Finnegan, Henderson, Farabow, Garrett & Dunner, L.L.P.

(57) ABSTRACT

The disclosure concerns a manufacturing method of a semiconductor device includes dry-etching a semiconductor substrate or a structure formed on the semiconductor substrate; supplying a solution onto the semiconductor substrate; measuring a specific resistance or a conductivity of the supplied solution; and supplying a removal solution for removing the etching residual material onto the semiconductor substrate for a predetermined period of time based on the specific resistance or the conductivity of the solution, when an etching residual material adhering to the semiconductor substrate or the structure is removed.

11 Claims, 9 Drawing Sheets

METHOD OF MANUFACTURING SEMICONDUCTOR DEVICE AND CLEANING APPARATUS

CROSS-REFERENCE TO RELATED APPLICATION

This application is based upon and claims the benefit of priority from the prior Japanese Patent Applications No. 2006-21024, filed on Jan. 30, 2006, the entire contents of which are incorporated herein by reference.

BACKGROUND OF THE INVENTION

1. Field of the Invention

The present invention relates to a method of manufacturing a semiconductor device and a cleaning apparatus.

2. Related Art

In manufacturing processes of a semiconductor device, in general, RIE (Reactive Ion Etching) is used as etching for a semiconductor substrate or etching for a structure formed on a semiconductor substrate. When a semiconductor substrate or a structure formed thereon is etched by the RIE, an etching residual material (to be simply referred to as a residual material hereinafter) adheres to the semiconductor substrate or the structure. The residual material is generally called polymer.

In order to remove the residual material, after the RIE step, the semiconductor substrate is exposed to a polymer removal solution. In a conventional technique, in this step, a plurality of semiconductor substrates are processed in units of lots or batches at once. More specifically, regardless of an amount of residual amount adhering to the semiconductor substrate or the like, a plurality of semiconductor substrates are dipped in the polymer removal solution for only a predetermined period of time.

However, when the plurality of semiconductor substrates are processed at once, pattern shapes of the semiconductor substrates or the structures change depending on the amounts of residual material. For example, if an amount of residual material adhering to an insulating interlayer is small, the insulating interlayer may be excessively etched by the polymer removal solution. Due to the excessive etching, an interconnection formed in the insulating interlayer by a damascene method becomes wider than a design width of the interconnection. As a result, the interconnection considerably influences the electric characteristics of the semiconductor device. Furthermore, if amounts of residual material adhering to the insulating interlayer and the bottom of a VIA are large, the residual materials may remain without being completely removed. This causes a defect by a short circuit of the interconnection, a defect by opening the interconnection, or a defect of a VIA contact. As a result, the defects considerably influence the electric characteristics of the semiconductor after all.

In general, as a polymer removal solution, a used solution is circulated for environmental conservation and reduction in cost and recycled. However, when a large number of semiconductor substrates are processed by using the same polymer removal solution, an etching rate varies with an increase in number of semiconductor substrates. This is because a polymer component dissolved from the semiconductor substrate remains in a polymer removal solution to increase the concentration of the polymer component in the removal solution. When the etching rate of the polymer removal solution varies, as described above, the electric characteristics of semiconductor devices are influenced. On the other hand, frequent exchanges of polymer removal solutions may adversely affect the environment and increase the costs (see JP-A H07-193045 (KOKAI)).

SUMMARY OF THE INVENTION

A manufacturing method of a semiconductor device according to an embodiment of the present invention comprises dry-etching a semiconductor substrate or a structure formed on the semiconductor substrate; supplying a solution onto the semiconductor substrate; measuring a specific resistance or a conductivity of the supplied solution; and supplying a removal solution for removing the etching residual material onto the semiconductor substrate for a predetermined period of time based on the specific resistance or the conductivity of the solution, when an etching residual material adhering to the semiconductor substrate or the structure is removed.

A manufacturing method of a semiconductor device according to an embodiment of the present invention comprises dry-etching a semiconductor substrate or a structure formed on the semiconductor substrate; supplying a solution from a nozzle onto the semiconductor substrate while scanning the semiconductor substrate from the end portion to the central portion thereof and while rotating the semiconductor substrate; periodically or continuously measuring a specific resistance or a conductivity of the supplied solution ; and supplying a removal solution for removing the etching residual material onto the semiconductor substrate while keeping the semiconductor substrate at a predetermined temperature on the basis of the specific resistance or the conductivity of the solution, when an etching residual material adhering to the semiconductor substrate or the structure is removed.

A manufacturing method of a semiconductor device according to an embodiment of the present invention comprises dry-etching a semiconductor substrate or a structure formed on the semiconductor substrate; supplying a solution onto the semiconductor substrate; measuring a specific resistance or a conductivity of the supplied solution; and determining a puddle time for accumulating a removal solution on a surface of the semiconductor substrate on the basis of the specific resistance or the conductivity of the supplied solution, the removal solution removing a etching residual material adhering to the semiconductor substrate or the structure during the dry-etching; determining a relative temperature between the semiconductor substrate and the removal solution on the basis of a coarseness/denseness of surface patterns of the semiconductor substrate; and supplying the removal solution, which has a temperature different from the semiconductor substrate by the relative temperature, on the semiconductor substrate, and accumulating the removal solution on the semiconductor substrate for the puddle time, when the etching residual material is removed.

A manufacturing method of a semiconductor device according to an embodiment of the present invention comprises dry-etching a semiconductor substrate or a structure formed on the semiconductor substrate; supplying a solution, which has an oxidation-reduction potential is 0.5 V or less, on the semiconductor substrate or the structure, to which an etching residual material adheres; removing the etching residual material by supplying the removal solution onto the semiconductor substrate or the structure.

A cleaning apparatus according to an embodiment of the present invention comprises a stage rotating a semiconductor substrate to which an etching residual material adheres, the stage controlling a temperature of the semiconductor substrate; a first nozzle which discharges a solution onto a surface of the semiconductor substrate; a measuring unit which measures a specific resistance or a conductivity of the solution discharged onto the semiconductor substrate; a processing unit which determines time for supplying the removal solution onto the semiconductor substrate on the basis of the specific resistance or the conductivity of the solution; and a second nozzle which discharges a removal solution for removing the etching residual material depending on the time determined by the processing unit.

A cleaning apparatus according to an embodiment of the present invention comprises a stage rotating a semiconductor substrate to which an etching residual material adheres, the stage controlling a temperature of the semiconductor substrate; a first nozzle which discharges a solution onto the semiconductor substrate while scanning the semiconductor substrate from the end portion to the central portion thereof; a measuring unit which measures a specific resistance or a conductivity of the solution discharged onto the semiconductor substrate; a second nozzle which discharges a removal solution for removing the etching residual material adhering to the semiconductor substrate; a processing unit which determines a temperature of the semiconductor substrate when the removal solution is supplied onto the semiconductor substrate on the basis of the specific resistance or the conductivity of the solution; and a temperature controller keeping a temperature of the stage at the temperature determined by the processing unit.

A cleaning apparatus according to an embodiment of the present invention comprises a stage rotating a semiconductor substrate to which an etching residual material adheres is placed, the stage controlling a temperature of the semiconductor substrate; a first nozzle which discharges a solution onto a surface of the semiconductor substrate; a measuring unit which measures a specific resistance or a conductivity of the solution discharged onto the semiconductor substrate; a processing unit which determines a puddle time for accumulating a removal solution on a surface of the semiconductor substrate on the basis of the specific resistance or the conductivity of the supplied solution, and which determines a relative temperature between the semiconductor substrate and the removal solution on the basis of a coarseness/denseness of surface patterns of the semiconductor substrate; and a second nozzle supplying the removal solution, which has a temperature different from the semiconductor substrate by the relative temperature, on the semiconductor substrate, wherein the removal solution is accumulated on the semiconductor substrate for the puddle time.

A cleaning apparatus according to an embodiment of the present invention comprises a stage on which a semiconductor substrate to which an etching residual material adheres is placed; a first nozzle supplying a solution onto the semiconductor substrate, the solution being having an oxidation-reduction potential of 0.5 V or less, a second nozzle which discharges a removal solution for removing the etching residual material adhering to the semiconductor substrate.

DETAILED DESCRIPTION OF THE INVENTION

Embodiments according to the present invention will be described below with reference to the accompanying drawings. The embodiments do not limit the present invention.

FIRST EMBODIMENT

Figure 1:
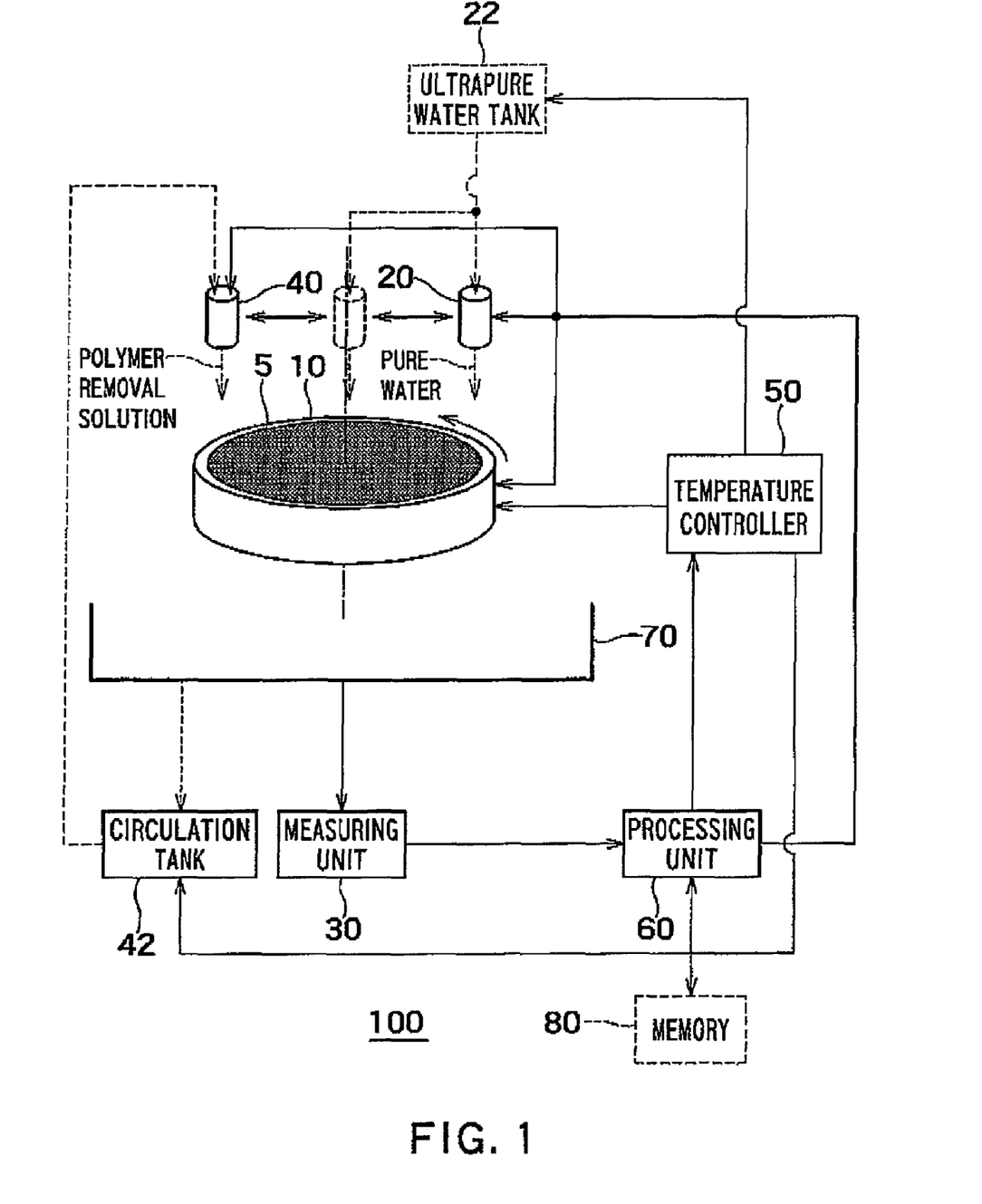
FIG. 1 is a schematic diagram of a cleaning apparatus 100 according to a first embodiment.

FIG. 1 is a schematic diagram of a cleaning apparatus 100 for a semiconductor substrate according to an embodiment of the present invention. A solid line in FIG. 1 indicates transmission and reception of a signal, and a broken line in FIG. 1 indicates movement of pure water or a chemical solution. The cleaning apparatus 100 is configured to supply a polymer removal solution to a semiconductor substrate 5 to remove an etching residual material (to be also referred to a polymer hereinafter) generated by RIE. For example, the cleaning apparatus 100 includes a stage 10, a first nozzle 20, a measuring unit 30, a second nozzle 40, a temperature controller 50, a processing unit 60, and a drain 70.

The semiconductor substrate 5 can be placed on the stage 10 to make it possible to rotate the semiconductor substrate 5. Furthermore, the stage 10 is configured to make it possible to control the temperature of the semiconductor substrate 5 depending on the temperature controller 50.

The first nozzle 20 can be moved between an end of the stage 10 and the center of the stage 10 while discharging the ultrapure water (hereinafter, pure water) supplied from a ultrapure water tank 22 onto the surface of the semiconductor substrate 5. The polymer includes ions. The pure water supplied from the first nozzle 20 onto the semiconductor substrate 5 removes ions from the residual material and falls down into the drain 70.

The drain 70 is arranged to store the solution falling down from the semiconductor substrate 5. The measuring unit 30 measures the conductivity of the solution falling down into the drain 70 to transmits information of the conductivity to the processing unit 60. The conductivity of the solution correlates with an ion concentration of the solution. The ion concentration of the solution correlates with an amount of etching residual material. Therefore, to know the conductivity of the solution is to know the amount of polymer adhering to the semiconductor substrate 5. For this reason, the processing unit 60 determines time required for the semiconductor substrate 5 to be exposed to the polymer removal solution on the basis of the conductivity of the solution. The correlation between the conductivity of the solution and the time required to expose the semiconductor substrate 5 to the polymer removal solution may be stored in a memory 80 in advance. At this time, the solution falling down into the drain 70 is discarded.

The second nozzle 40 discharges the polymer removal solution. The second nozzle 40 can move between an end of the stage 10 and the center of the stage 10 like the first nozzle 20. The second nozzle 40 supplies the removal solution to the semiconductor substrate 5 for time period determined by the processing unit 60. The polymer removal solution falling down from the semiconductor substrate 5 into the drain 70 is recovered by a circulation tank 42. After impurity is collected from the polymer removal solution by using a filter or the like (not shown), the polymer removal solution is recycled.

The temperature controller 50 controls the temperatures of the pure water in the stage 10 and the pure water tank 22, and the temperature of the polymer removal solution in the circulation tank 42. In the embodiment, the temperatures of the pure water and the polymer solution are constant.

Figure 2:
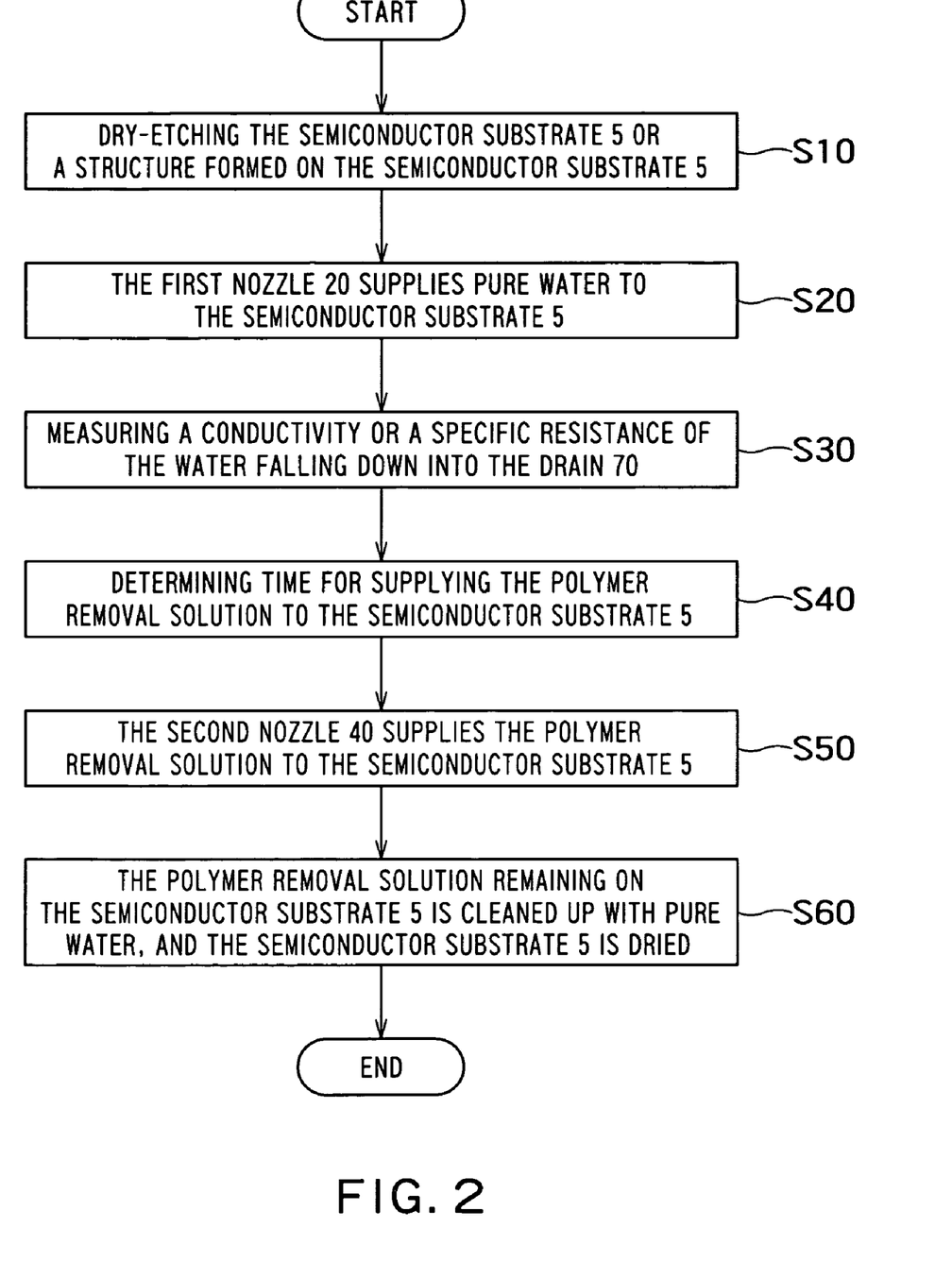
FIG. 2 is a flow chart of operations of the cleaning apparatus 100.

FIG. 2 is a flow chart showing a flow of operations of the cleaning apparatus 100. In an etching device different (not shown) from the cleaning apparatus 100, the semiconductor substrate 5 is dry-etched by using RIE, or a structure formed on the semiconductor substrate 5 is dry-etched (S10). The semiconductor substrate 5 is brought into vacuum contact with the stage 10 to rotate the stage 10 together with the semiconductor substrate 5. At this time, the temperature controller 50 keeps the temperatures of the stage 10 and the semiconductor substrate 5 constant. The first nozzle 20 supplies pure water to the semiconductor substrate 5 (S20). At this time, in the first embodiment, the first nozzle 20 is positioned at the center of the semiconductor substrate 5 to supply pure water at a predetermined flow rate. This pure water cleans the surface of the semiconductor substrate 5 and then falls down into the drain 70.

Ion components included in the polymer change depending on etching gases used in RIE. For example, an etching gas containing a CF-based gas is used, fluorine ions are contained in the polymer. Therefore, in this case, the fluorine ions are contained in the water falling down into the drain 70. For example, when an etching gas containing an ammonia gas is used, ammonium ions are contained in the polymer. Therefore, in this case, the ammonium ions are contained in the water falling down into the drain 70. Furthermore, for example, an etching gas containing an HBr gas is used, bromine ions are contained in polymer. Therefore, in this case, the bromine ions are contained in the water falling down in to the drain 70.

The measuring unit 30 periodically or continuously measures the conductivity of the water falling down into the drain 70 on real time (S30). Since the conductivity of the water changes depending on the ion components contained in the water falling down into the drain 70, an amount of polymer adhering to the semiconductor substrate 5 can be estimated by measuring the conductivity of the water. As a method of measuring the conductivity of the water, a known method may be used.

Figure 3:
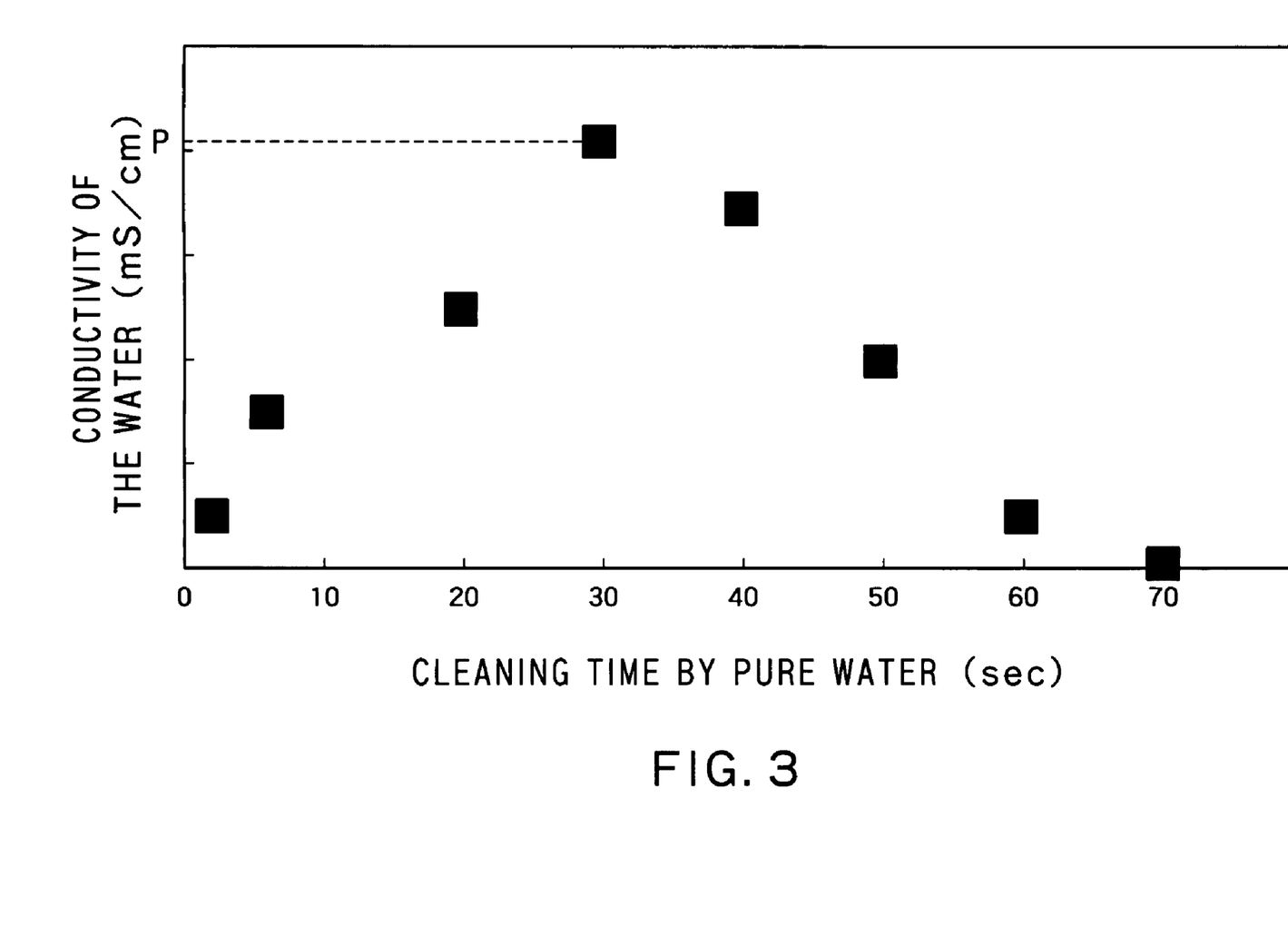
FIG. 3 is a graph showing a relationship between cleaning time by pure water and the conductivity of the water.

FIG. 3 is a graph showing a relationship between cleaning time by pure water and the conductivity of the water. According to this graph, the conductivity gradually increases from the start of cleaning. This is because the ions contained in the polymer are gradually dissolved in the pure water supplied onto the semiconductor substrate 5. At the maximum value P in the graph, the number of ions contained in the water is maximum. Thereafter, the conductivity gradually decreases. This is because the ions in the polymer decrease in number to decrease the number of ions dissolved in the water. The measuring unit 30 transmits the measurement result to the processing unit 60.

After the first nozzle 20 stops supplying of the pure water, the stage 10 further rotates the semiconductor substrate 5 to remove moisture adhering to the semiconductor substrate 5. In this manner, the polymer removal solution is prevented from being diluted by the moisture. In order to prevent watermarks generated on the semiconductor substrate 5, the moisture may be removed while purging nitrogen. When aqueous solution with a high water content is used as the polymer removal solution, the semiconductor substrate 5 need not be completely dried.

FIG. 2 is referred again. The processing unit 60 determines time for exposing the semiconductor substrate 5 to the polymer removal solution on the basis of the maximum value P of the conductivity. More specifically, the processing unit 60 determines time for supplying the polymer removal solution to the semiconductor substrate 5 by the second nozzle 40 (S40). The maximum value P of the conductivity is in proportion to the amount of polymer adhering to the semiconductor substrate 5. Therefore, the maximum value P of the conductivity makes the amount of polymer clear. An etching rate when the polymer removal solution removes polymer is made clear in advance. Therefore, a correlation between the maximum value P of the conductivity and the supply time of the polymer removal solution can be set in advance. A table representing the correlation may be stored in the memory 80 arranged inside or outside the cleaning apparatus 100 in advance or stored in a memory (not shown) in the processing unit 60 in advance. The processing unit 60 acquires data of the supply time of the polymer removal solution corresponding to the peak value P of the conductivity from the memory to make it possible to control the second nozzle 40 such that the polymer removal solution to the semiconductor substrate 5 for the supply time.

The second nozzle 40 supplies the polymer removal solution to the semiconductor substrate 5 depending on the supply time determined by the processing unit 60 (S50). In the embodiment, the second nozzle 40 is positioned at the center of the semiconductor substrate 5 to supply the polymer removal solution at a predetermined flow rate. The temperature of the polymer removal solution is kept constant. The polymer removal solution removes polymer adhering to the semiconductor substrate 5 or the structure formed on the semiconductor substrate 5 and then falls down into the drain 70. The used polymer removal solution is recovered by the circulation tank 42 and recycled to remove polymer.

The polymer removal solution remaining on the semiconductor substrate 5 is cleaned up with pure water, and the semiconductor substrate 5 is dried by spin drying (S60). As a drying means, IPA vapor drying may be used. Thereafter, the semiconductor substrate 5 goes through conventional steps. In this manner, a semiconductor substrate is formed on the semiconductor substrate 5.

In the first embodiment, polymer removal solutions of different types may be used.

In the first embodiment, the measuring unit 30 measures the conductivity of water. However, the measuring unit 30 may measure the specific resistance of water. The specific resistance is in inverse proportion to the conductivity. Therefore, the processing unit 60 may determine supply time of a polymer removal solution on the basis of the minimum value of the specific resistance. Furthermore, the measuring unit 30 may detect an ion concentration in the water. Since the ion concentration is in proportion to the conductivity, supply time of the polymer removal solution can be determined on the basis of the maximum value of the ion concentration.

In the embodiment, the processing unit 60 determines the supply time of the polymer removal solution on the basis of the maximum value of the ion concentration. However, the processing unit 60 may determines a supply amount of the polymer removal solution. The second nozzle 40 supplies the polymer removal solution at a predetermined flow rate. For this reason, the supply time of the polymer removal solution is automatically determined by determining the supply amount of the polymer removal solution.

In this manner, in the embodiment, before cleaning is performed by the polymer removal solution, the cleaning step using pure water is introduced, so that an amount of polymer adhering to each semiconductor substrate is estimated. The semiconductor substrate is exposed to the polymer removal solution for the time corresponding to the amount of polymer. In this manner, even though amounts of adhering polymer vary depending on semiconductor substrates, each semiconductor substrate can be appropriately cleaned.

When the cleaning step using pure water (to be referred to pre-cleaning) is introduced before the processing using the polymer removal solution, the pure water removes ion component in the polymer. In this manner, an etching rate of the polymer removal solution is stabilized regardless of the number of processed semiconductor substrates (see FIG. 4).

Figure 4:
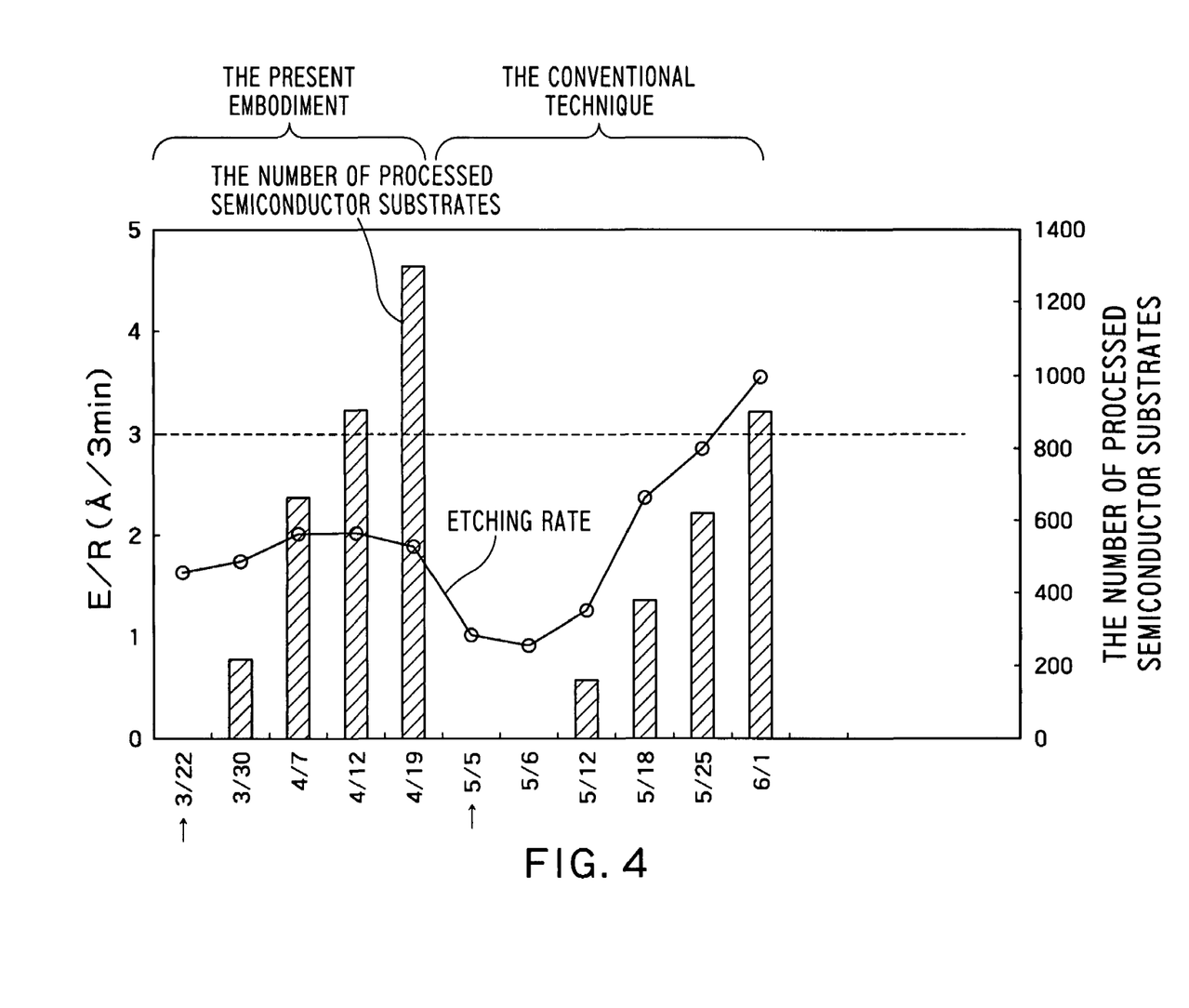
FIG. 4 is a graph showing a relationship between an etching rate of the polymer removal solution and the number of processed semiconductor substrates.

FIG. 4 is a graph showing a relationship between an etching rate of the polymer removal solution and the number of processed semiconductor substrates. A bar graph indicates the number of processed semiconductor substrates, and a line graph indicates the etching rate. The left ordinate indicates the etching rate (angstrom/3 minutes), the right ordinate indicates the number of processed semiconductor substrates. The abscissa indicates dates. A date marked by an arrow indicates a date on which polymer removal solutions are exchanged.

The polymer removal solutions were exchanged on March 22nd, semiconductor substrates were processed according to the embodiment for a period from March 22nd, to April 19th. The polymer removal solutions were exchanged on May 5th, semiconductor substrates were processed according to a conventional technique for a period from May 5th to June 1st. The polymer removal solution is circulated in the cleaning apparatus 100 until the next exchange of the polymer removal solutions, and impurities are removed by a filter or the like. Thereafter, the polymer removal solution is used again.

In a conventional cleaning apparatus according to the conventional technique (May 5th to June 1st), with an increase in number of processed semiconductor substrates, an etching rate (E/R) of the polymer removal solution increases. For example, if the tolerance of the etching rate is 3 angstroms/3 minutes, the etching rate may exceed the tolerance when the number of processed semiconductor substrates is larger than about 600. In the conventional technique, the semiconductor substrate 5 is dipped in the polymer removal solution without being subjected to pre-cleaning. In this manner, the ion concentration of the polymer removal solution increases, and the etching rate increases.

On the other hand, in the cleaning apparatus according to the embodiment (March 22nd to April 19th), even though the number of processed semiconductor substrates increased, the etching rate of the polymer removal solution slightly changed. For example, an etching rate at the beginning of the exchange of the polymer removal solutions (March 22nd), is about 1.7 angstroms/3 minutes. In contrast to this, an etching rate after 1200 or more semiconductor substrates are processed is about 1.9 angstroms/3 minutes. This is because, in the embodiment, the ion concentration of the polymer removal solution slightly changes since pre-cleaning is performed. In this manner, according to the embodiment, the etching rate of the polymer removal solution can be kept constant while an exchange cycle of the polymer removal solutions is set to be almost equal to or longer than that of the conventional device. As a result, the lifetime of the polymer removal solution can be made longer than that in the conventional device. Therefore, the embodiment does not adversely effect on an environmental conservation and reduces in cost. As a matter of course, the embodiment can also be applied to a device in which a single-use polymer removal solution is used without recycling the polymer removal solution.

The embodiment can be applied to all steps in which polymer is removed after processing of RIE. For example, the embodiment can be applied to the polymer removing step after an interconnection groove or a VIA is formed in an insulating interlayer in a damascene process or a dual damascene process. The embodiment can also be applied to the polymer removing step performed after a gate electrode is etched.

SECOND EMBODIMENT

In a second embodiment, the temperatures of an end portion of a semiconductor substrate 5 and a central portion thereof in the polymer removing step are made different from each other on the basis of a distribution of amounts of polymer adhering to the semiconductor substrate 5. In this manner, etching rates of a polymer removal solution at the end portion and the central portion of the semiconductor substrate 5 are made different from each other.

Figure 5:
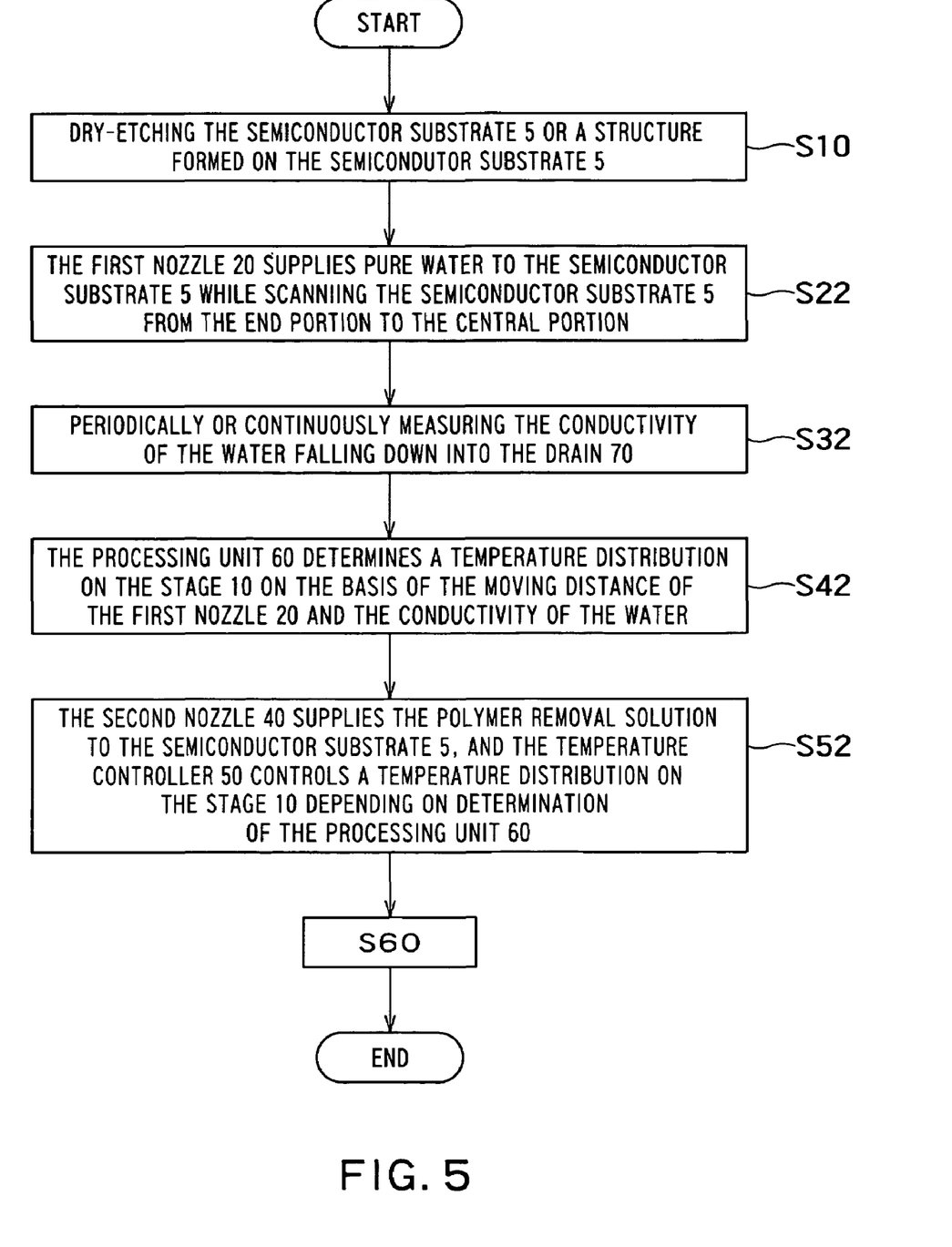
FIG. 5 is a flow chart of operations of a cleaning apparatus according to the second embodiment.

FIG. 5 is a flow chart showing a flow of operations of a cleaning apparatus according to the second embodiment of the present invention. The second embodiment can be executed by using the cleaning apparatus 100 shown in FIG. 1.

As in FIG. 2, after step S10, the semiconductor substrate 5 is brought into vacuum contact with a stage 10 of the cleaning apparatus 100, and the stage 10 is rotated together with the semiconductor substrate 5. At this time, a temperature controller 50 keeps the temperatures of the stage 10 and the semiconductor substrate 5 constant. The first nozzle 20 supplies pure water to the semiconductor substrate 5 while scanning the semiconductor substrate 5 from the end portion to the central portion (S22). The temperature of the pure water is kept constant. This pure water dissolves an ion component in polymer and then falls down into a drain 70. Therefore, as described above, ions are contained in the water falling down into the drain 70.

Figure 6:
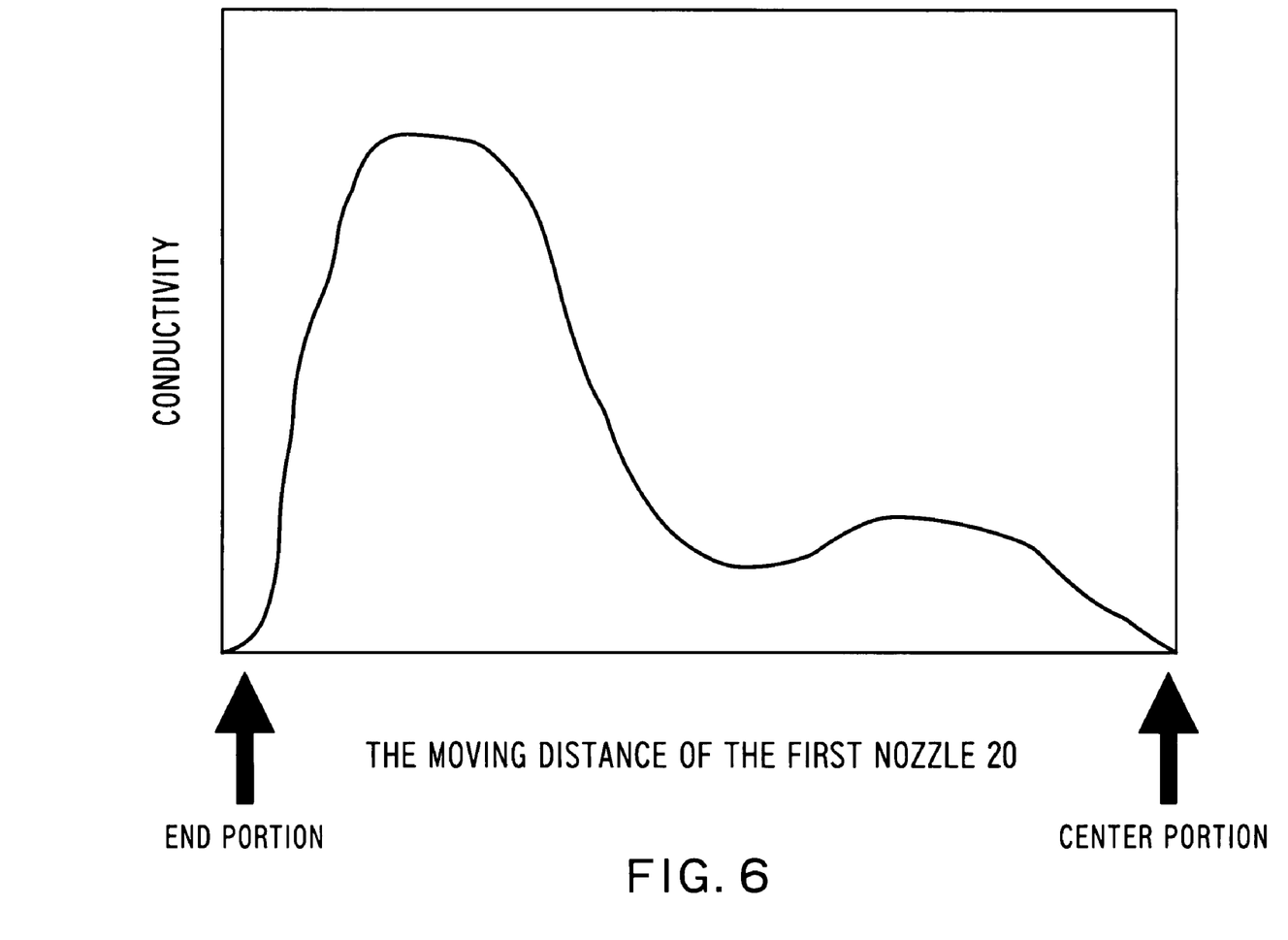
FIG. 6 shows an example in which a certain amount of polymer adheres to the end portion of the semiconductor substrate 5.

A measuring unit 30 measures periodically or continuously measures the conductivity of the water falling down into the drain 70 on real time (S32). FIG. 6 is a graph showing a relationship between a moving distance of the first nozzle 20 and the conductivity of the water. In the second embodiment, the first nozzle 20 scans the semiconductor substrate 5 from the end portion of the semiconductor substrate 5 to the central portion thereof. Therefore, the conductivity of the water which cleans the end portion of the semiconductor substrate 5 is measured while the first nozzle 20 scans the end portion of the semiconductor substrate 5. In this manner, an amount of polymer adhering to the end portion of the semiconductor substrate 5 can be estimated. When the first nozzle 20 is close to the central portion of the semiconductor substrate 5, the conductivity of the water which cleans a portion around the central portion of the semiconductor substrate 5 is measured. When the first nozzle 20 is close to the central portion of the semiconductor substrate 5, the pure water passes through not only the central portion of the semiconductor substrate 5 but also the end portion. However, ions at the end portion of the semiconductor substrate 5 have been cleaned up, the water contains only an ion component present at the central portion of the semiconductor substrate 5. In this manner, an amount of polymer adhering to the central portion of the semiconductor substrate 5 can be estimated.

FIG. 6 shows an example in which a large amount of polymer adheres to the end portion of the semiconductor substrate 5 and a relatively small amount of polymer adheres to the central portion of the semiconductor substrate 5. The measuring unit 30 transmits the measurement result to a processing unit 60.

FIG. 5 is referred to again. The processing unit 60 determines a temperature distribution on the stage 10 on the basis of the moving distance of the first nozzle 20 and the conductivity of the water (S42). More specifically, the processing unit 60 determines the temperature of the stage 10 such that the temperature is in proportion to the conductivity of the water. For example, the processing unit 60 sets the temperature of the end portion of the stage 10 high depending on the conductivity shown in FIG. 6, and sets the temperature of the central portion low. A table representing the correlation between the conductivity of the water and the stage temperature may be stored in the memory 80 arranged inside or outside the cleaning apparatus 100 in advance or stored in a memory (not shown) in the processing unit 60 in advance. The processing unit 60 may acquire data of the stage temperature corresponding to the conductivity from the memory to control the temperature controller 50 such that the semiconductor substrate 5 is kept at the stage temperature.

The second nozzle 40 supplies the polymer removal solution to the semiconductor substrate 5 (S52). In the second embodiment the second nozzle 40 operates like the first nozzle 20. More specifically, the second nozzle 40 moves from the end portion of the semiconductor substrate 5 to the central portion thereof at the same rate as that of the first nozzle while supplying the polymer removal solution at a predetermined flow rate. At this time, the temperature controller 50 controls a temperature distribution on the stage 10 depending on determination of the processing unit 60. For example, the temperature controller 50 controls a temperature relatively high at the end portion of the semiconductor substrate 5 having a large amount of adhering polymer and controls a temperature relatively low at the central portion of the semiconductor substrate 5 having a small amount of adhering polymer. In this manner, according to the second embodiment, the etching rate of the polymer removal solution is relatively high at the end portion of the stage 10, and the etching rate is relatively low at the central portion of the stage 10.

Thereafter, the polymer removal solution remaining on the semiconductor substrate 5 is cleaned up with pure water and dried (S60). Furthermore, the semiconductor substrate 5 go through conventional steps to form a semiconductor device on the semiconductor substrate 5.

Figure 7:
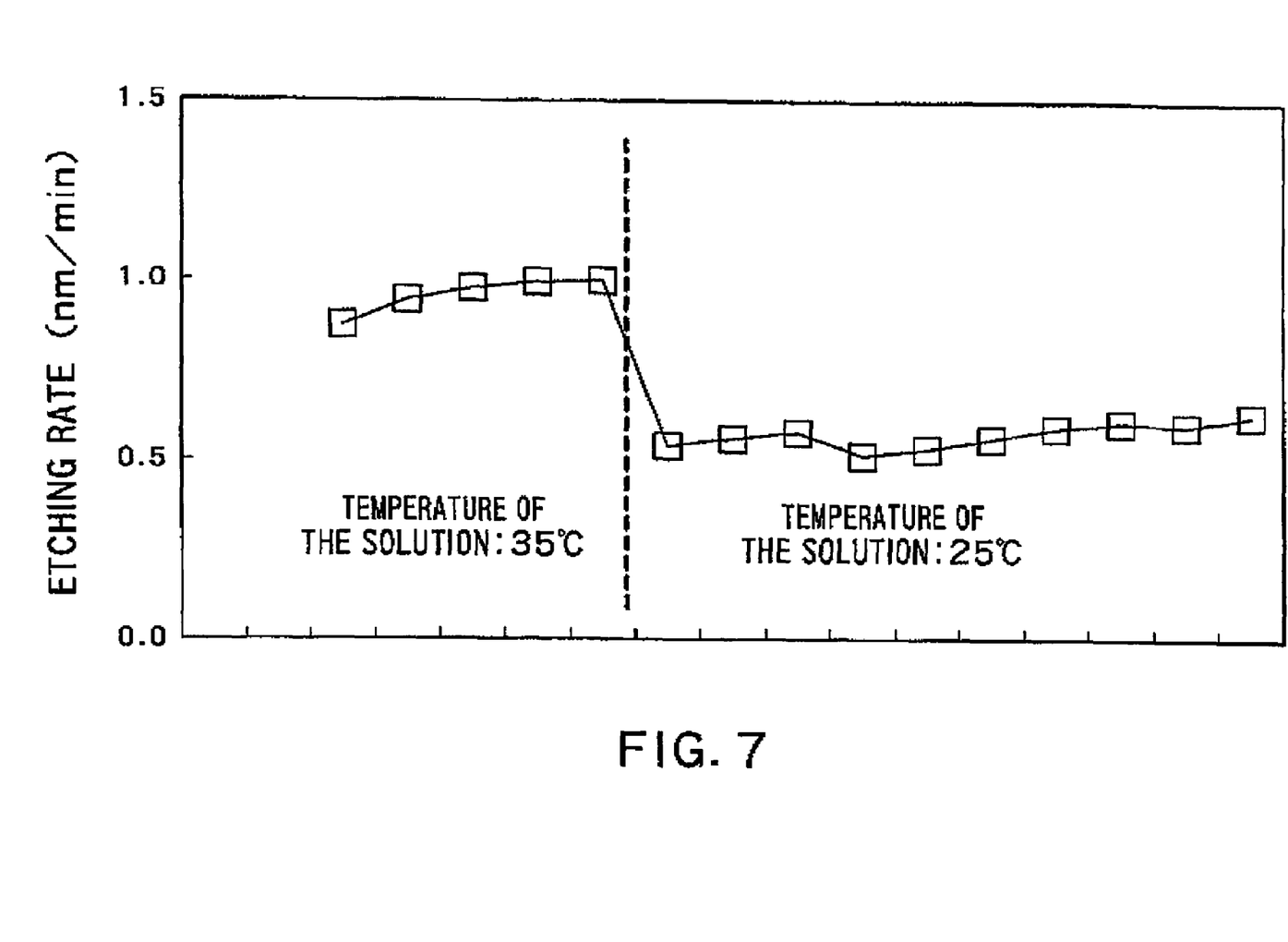
FIG. 7 is a graph showing a relationship between the temperature of the polymer removal solution and the etching rate of the polymer removal solution.

FIG. 7 is a graph showing a relationship between the temperature of the polymer removal solution and the etching rate of the polymer removal solution. When the temperature of the polymer removal solution is 35° C., the etching rate of the polymer removal solution ranges from 0.8 to 1.0 nm/min. In contrast to this, when the temperature of the polymer removal solution is 25° C., the etching rate of the polymer removal solution ranges from 0.5 to 0.6 nm/min. In this manner, as the temperature increases, the etching rate of the polymer removal solution becomes high. The second embodiment uses the characteristics of the polymer removal solution.

According to the second embodiment, even though an amount of adhering polymer fluctuates in the plane of the semiconductor substrate 5, the polymer can be removed depending on a distribution of amounts of adhering polymer. Furthermore, according to the second embodiment, the same effects as those in the first embodiment can be obtained.

In the second embodiment, the measuring unit 30 measures the conductivity of water. However, the measuring unit 30 may measure the specific resistance of water. In this case, since the conductivity of water is in inverse proportion to the specific resistance of water, it is preferable that the temperature of a portion is highly set where the specific resistance of water is small. Furthermore, the measuring unit 30 may detects an ion concentration of the water. Since the ion concentration is in proportion to the conductivity, it is preferable that supply time of the polymer removal solution is determined on the basis of the maximum value of the ion concentration.

THIRD EMBODIMENT

In the third embodiment, in the polymer removing step, a relative temperature between a semiconductor substrate 5 and a polymer removal solution are determined on the basis of a distribution of amounts of polymer adhering to the semiconductor substrate 5 and the coarseness/denseness of surface patterns formed on the semiconductor substrate 5. In order to change the temperature of the polymer removal solution on the basis of the coarseness/denseness of the surface patterns of the semiconductor substrate 5, a second nozzle 40 does not continuously supply the polymer removal solution, but accumulates the polymer removal solution on the surface of the semiconductor substrate 5 by using surface tension. This operation is called a puddle. Time for accumulating the polymer removal solution on the surface of the semiconductor substrate 5 is called puddle time.

Figure 8:
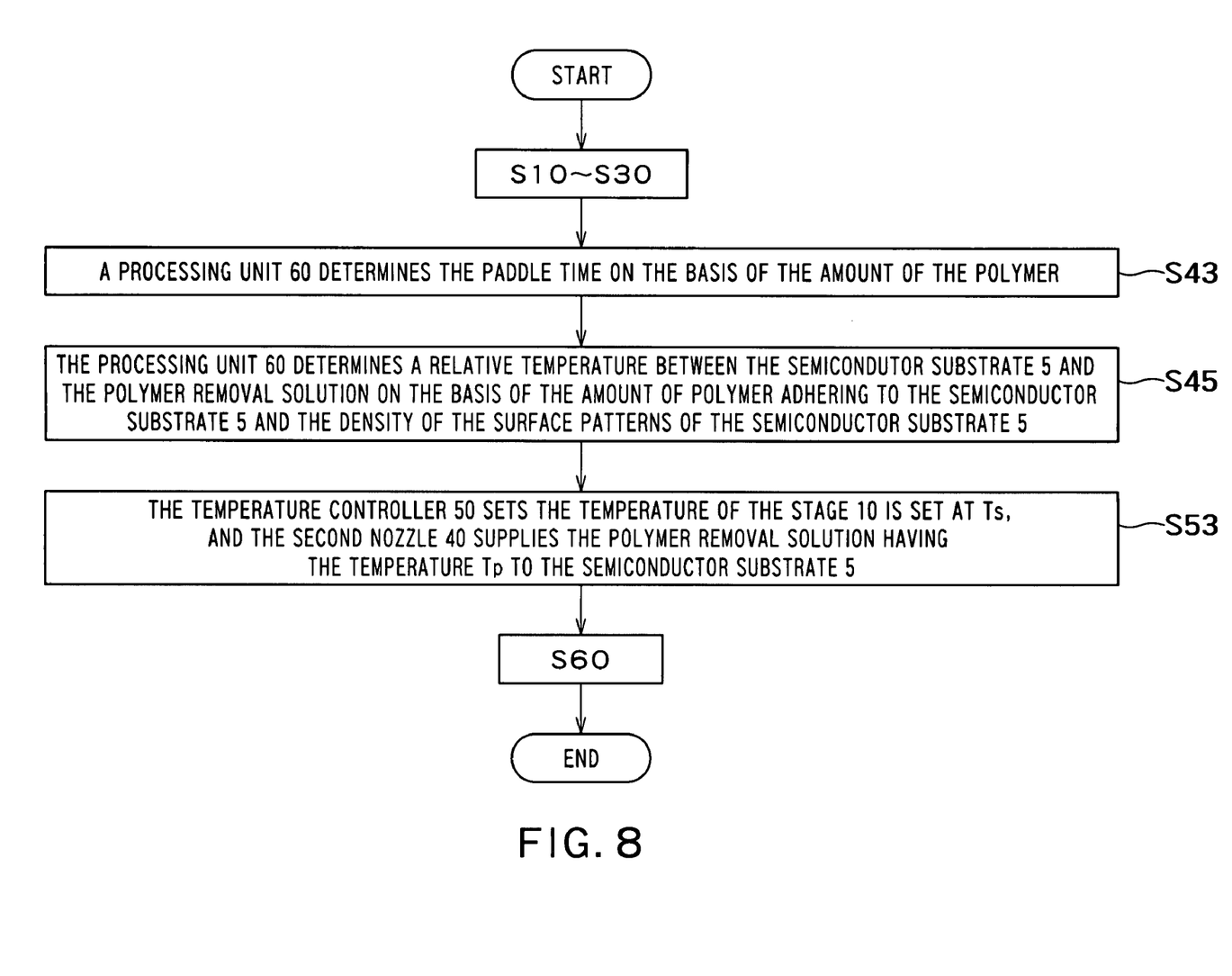
FIG. 8 is a flow chart of operations of the cleaning apparatus 100 according to the third embodiment.

FIG. 8 is a flow chart showing a flow of operations of the cleaning apparatus 100 according to the third embodiment. The third embodiment can be executed by using the cleaning apparatus 100 shown in FIG. 1.

The third embodiment is the same as the first embodiment with respect to steps S10 to S30 in FIG. 2. In this manner, a temperature controller 50 can calculates an amount of polymer adhering to the semiconductor substrate 5. A processing unit 60 determines the puddle time on the basis of the amount of the polymer (S43). For example, when the amount of adhering polymer is large as a whole, the puddle time is elongated. When the amount of adhering polymer is small as a whole, the puddle time is shortened.

The processing unit 60 determines a relative temperature between the semiconductor substrate 5 and the polymer removal solution on the basis of the amount of polymer adhering to the semiconductor substrate 5 and the density of the surface patterns of the semiconductor substrate 5 (S45). When the temperature of the semiconductor substrate 5 and the temperature of the polymer removal solution are represented by Ts and Tp, respectively, the relative temperature is given by |Ts−Tp|.

The density of the surface patterns of the semiconductor substrate 5 is made clear from information of a photomask or the like in advance. The information of the coarseness/denseness of the surface patterns may be stored in a memory 80 in advance. A relationship between the density of the surface patterns and the amount of adhering polymer is empirically made clear. More specifically, when etching is generally performed by using RIE, an amount of adhering polymer is small in a region in which the density of the surface patterns is high.

In contrast to this, an amount of adhering polymer is large in a region in which the density of the surface patterns. In such a case, the processing unit 60 makes the temperature Tp of the polymer removal solution higher than the temperature Ts of the semiconductor substrate 5 in the polymer removing step (Tp>Ts).

Figure 9A:
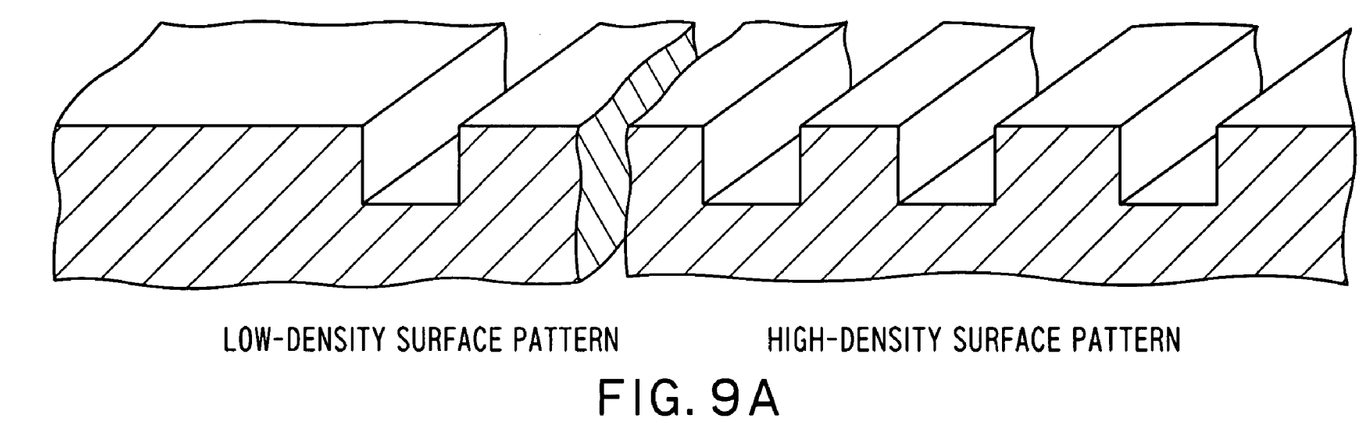
FIG. 9A shows a groove pattern formed on the semiconductor substrate 5 in the damascene process.
Figure 9B:
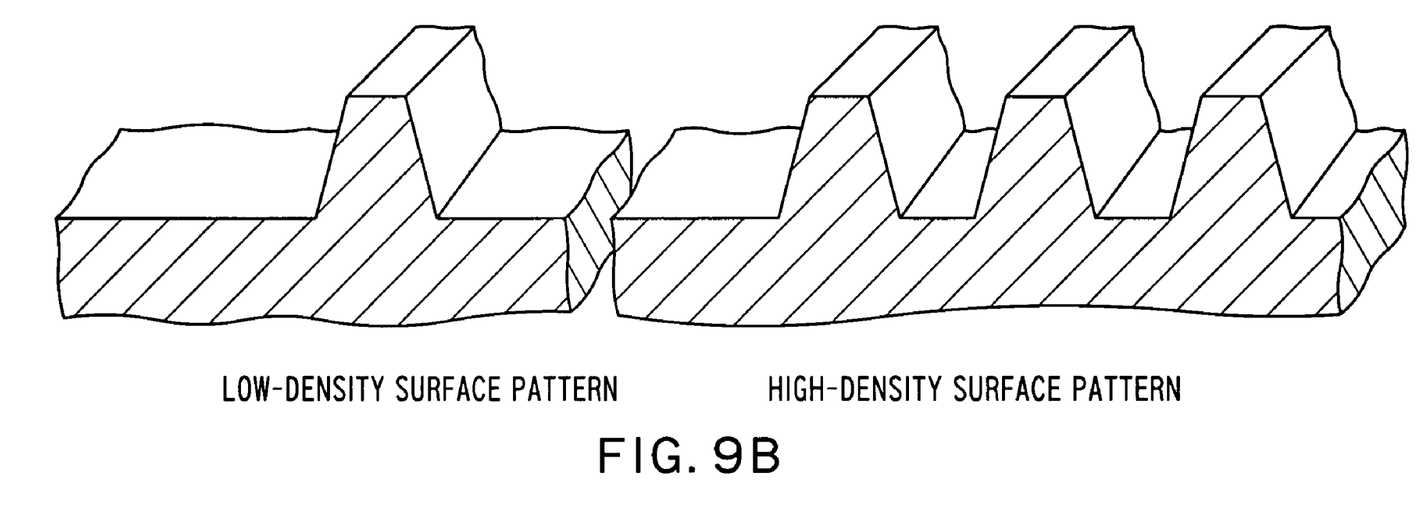
FIG. 9B shows an interconnection pattern formed on the semiconductor substrate 5.

FIG. 9A shows a groove pattern formed on the semiconductor substrate 5 in the damascene process. FIG. 9B shows an interconnection pattern formed on the semiconductor substrate 5. As shown in FIGS. 9A and 9B, in a region having high-density surface patterns, a contact area between the semiconductor substrate 5 and the polymer removal solution is large. In the region having low-density surface patterns, a contact area between the semiconductor substrate 5 and the polymer removal solution is small. Therefore, since the temperature of the polymer removal solution decreases to the temperature of the semiconductor substrate 5 at a relatively high rate, the etching rate becomes low in the region having a small amount of adhering polymer. On the other hand, in the region having high-density surface patterns, a contact area between the semiconductor substrate 5 and the polymer removal solution is small. Therefore, since the temperature of the polymer removal solution decreases at a relatively low rate, an etching rate in the region having a large amount of adhering polymer is relatively high.

When an amount of adhering polymer is large in the region having the high-density surface patterns and an amount of adhering polymer is small in the region having the low-density surface patterns, the processing unit 60 makes the temperature Ts of the semiconductor substrate 5 higher than the temperature Tp of the polymer removal solution in the polymer removing step (Ts>Tp).

In this case, in the region having the high-density surface patterns, the temperature of the polymer removal solution increases to the temperature of the semiconductor substrate 5 at a relatively high rate, the etching rate becomes high in the region having the large amount of polymer. On the other hand, in the region having the low-density surface patterns, since the temperature of the polymer removal solution increases at a relatively low rate, the etching rate in the region having the small amount of adhering polymer becomes relatively low.

FIG. 8 is referred to again. The temperature controller 50 sets the temperature of the stage 10 is set at Ts, and the temperature of the polymer removal solution is set at Tp. The second nozzle 40 supplies the polymer removal solution having the temperature Tp to-the semiconductor substrate 5 (S53). At this time, the polymer removal solution is accumulated on the semiconductor substrate 5 for a predetermined period of time. The semiconductor substrate 5 is rotated to spin off the polymer removal solution to the drain 70. Thereafter, the semiconductor substrate 5 goes through the same steps as those in the first embodiment to form a semiconductor device.

A puddle may be repeated more than once. For example, when a temperature difference between the semiconductor substrate 5 and the polymer removal solution decreases as a whole regardless of the coarseness/denseness of patterns, the polymer removal solution may be spun off from the semiconductor substrate 5 once, and the puddle operation may be performed.

According to the third embodiment, only the polymer can be removed without excessively etching the semiconductor substrate 5. Therefore, damage to the semiconductor substrate 5 is suppressed. Furthermore, the third embodiment can achieve the same effects as those in the first embodiment.

FOURTH EMBODIMENT

In the first to third embodiments, before removal of polymer, pure water is supplied to a semiconductor substrate 5 for pre-cleaning (step S20 in FIG. 2 and step S22 in FIG. 5).

However, for example, when copper for an interconnection is exposed on the bottom of a VIA, pure water disadvantageously etches the copper, or copper is disadvantageously deposited by the pre-cleaning.

Therefore, in the fourth embodiment, before removal of polymer, a low oxidative solution is provided as the pre-cleaning solution to the semiconductor substrate 5. The low oxidative solution is a solution having an oxidation-reduction potential of 0.5 V or less. This is because if the oxidation-reduction potential is higher than 0.5 V, the probability of etching an underlying material becomes high when the component of the underlying material is mostly copper. At this time, in order to more suppress the etching, the solution having the oxidation-reduction potential of 0.5 V or less is desirably a neutral or acidic solution having about pH9 or less.

The other configurations and the other operations of the cleaning apparatus according to the fourth embodiment may be the same as those in any one of the first to third embodiments. Therefore, the cleaning apparatus according to the fourth embodiment can be operated by using the cleaning apparatus 100 shown in FIG. 1. A first nozzle 20 is configured to supply a solution having an oxidation-reduction potential of 0.5 or less to the semiconductor substrate 5. The cleaning apparatus according to the fourth embodiment can be operated according to an operation flow in FIG. 2, 5, or 8. In step S20 or S22, in place of pure water, a solution having an oxidation-reduction potential of 0.5 V or less is supplied to the semiconductor substrate 5.

As a low oxidative solution having an acidic property, for example, a solution including any one of an inorganic acid such as a hydrochloric acid, a chloric acid, a hypochlorous acid, a chlorous acid, a perchloric acid, a hydrofluoric acid, a hydro cyanic acid, a carbonic acid, hydrogencarbonate, a sulfuric acid, a sulfurous acid, nitric acid, a nitrous acid, or a phosphoric acid and an organic acid such as a formic acid, an oxalic acid, an acetic acid, a citric acid, a maleic acid, a malonic acid, an oleic acid, a tartaric acid, or a glyoxylic acid is used.

As in the fourth embodiment, when pre-cleaning is performed by a solution having a low oxidative property, copper is not etched, and copper is not deposited. Any effect in the first to third embodiments can be achieved by combining the fourth embodiment to any one of the first to third embodiments.

In the fourth embodiment, in place of pre-cleaning by pure water, pre-cleaning by a solution having a low oxidative solution is executed. However, together with the pre-cleaning by pure water, before the pre-cleaning by pure water, the pre-cleaning by the solution having a low oxidative property may be executed. More specifically, in the fourth embodiment, before step S20 or S22 in FIGS. 2, 5 and 8, the step of executing pre-cleaning by the solution having a low oxidative property may be added. In this manner, the solution having a low oxidative property can be removed from the surface of the semiconductor substrate 5 before removal of polymer.

A low oxidative solution having an acidic property may be a chemical solution in which a gas which dissolves in water to make an acidic solution may dissolve. The gas which dissolve in water to make an acidic solution is, for example, HCI, HF, CO, $CO_2$, NO, $NO_2$, $SO_2$, $SO_3$, or the like. In the water (to be referred to as gas water hereinafter) in which the gas dissolves, the concentration of the dissolved gas becomes low when the gas vapors. Therefore, after pre-cleaning is executed by the gas water, the surface of the semiconductor substrate 5 need not be rinsed. As a result, processing time can be shortened.

For example, even though pre-cleaning is executed by gas water in which $CO_2$ having a specific resistance of about 0.01 to 0.02 MΩ·cm dissolves, copper is not etched, and copper is not deposited.

MODIFICATION OF FOURTH EMBODIMENT

The fourth embodiment is executed by combining the fourth embodiment to the first to third embodiments. However, the combination of the fourth embodiment and the first to third embodiment is not always necessary.

A modification of the fourth embodiment, differ from the first embodiment, does not execute the control for the supply time of the removal solution and the temperatures of the stage.

In the modification of the fourth embodiment, as in step S10 in FIG. 2, a semiconductor substrate 5 or a structure formed on the semiconductor substrate 5 is dry-etched. Thereafter, a solution having a low oxidative property is supplied onto the semiconductor substrate 5 to pre-clean the surface of the semiconductor substrate 5. Furthermore, the polymer removal solution is supplied onto the semiconductor substrate 5 to remove an etching residual material adhering to the semiconductor substrate or the structure.

The solution having a low oxidative property may be the solution having the low oxidative property according to the fourth embodiment. As in the fourth embodiment, a neutral or acidic solution having about pH9 or less is desirably used. The acidic solution having a low oxidative property may be water in which $CO_2$ having a specific resistance of about 0.1 to 0.2 MΩ·cm dissolves.

According to the modification, an etching rate of the polymer removal solution does not increase relative to that in execution of pre-cleaning by pure water. More specifically, even though pre-cleaning is executed on a large number of semiconductor substrates, the degree of increase of the etching rate of the polymer removal solution can be suppressed to a level lower than that in a conventional art by using an acidic solution having a low oxidative property.

What is claimed is:

1. A manufacturing method of a semiconductor device comprising:
    dry-etching a semiconductor substrate, or an insulating interlayer structure or a gate electrode material formed on the semiconductor substrate, wherein etching residue material is left on the etched surface;
    supplying a solution onto the semiconductor substrate and the solution being collected;
    measuring a specific resistance or a conductivity of the collected supplied solution; and
    supplying a removal solution onto the semiconductor substrate for removing the etching residual material from the etched surface of the semiconductor substrate for a predetermined period of time based on the specific resistance or the conductivity of the supplied solution, when an etching residual material adhering to the semiconductor substrate or the structure is removed.

2. The manufacturing method of a semiconductor device according to claim 1, wherein
    the supplied solution supplied onto the semiconductor substrate is a solution having an oxidation-reduction potential of 0.5 V or less.

3. The manufacturing method of a semiconductor device according to claim 1, wherein
    the supplied solution supplied onto the semiconductor substrate is pure water.

4. The manufacturing method of a semiconductor device according to claim 1, wherein
    the specific resistance or the conductivity of the supplied solution is periodically or continuously measured,
    the predetermined period for supplying the removal solution is determined on the basis of a minimum value of the specific resistance or a maximum value of the conductivity of the supplied solution.

5. A manufacturing method of a semiconductor device comprising:
    dry-etching a semiconductor substrate, or an insulating interlayer structure or a gate electrode material formed on the semiconductor substrate, wherein etching residue material is left on the etched surface;
    supplying a solution from a nozzle onto the semiconductor substrate and the solution being collected while scanning the semiconductor substrate from the end portion to the central portion thereof and while rotating the semiconductor substrate;
    periodically or continuously measuring a specific resistance or a conductivity of the collected supplied solution; and
    supplying a removal solution onto the semiconductor substrate for removing the etching residual material from the etched surface of the semiconductor substrate while keeping the semiconductor substrate at a predetermined temperature on the basis of the specific resistance or the conductivity of the supplied solution, when an etching residual material adhering to the semiconductor substrate or the structure is removed.

6. The manufacturing method of a semiconductor device according to claim 5, wherein
    at least a temperature of an end portion of the semiconductor substrate and a temperature of the central portion of the semiconductor substrate are independently determined on the basis of a specific resistance or a conductivity of a solution supplied to the end portion of the semiconductor substrate and a specific resistance or a conductivity of a solution supplied to the central portion of the semiconductor substrate; and
    during the removing of the etching residual material, the removal solution is supplied onto the semiconductor substrate while keeping the end portion of the semiconductor substrate and the central portion of the semiconductor substrate at temperatures determined for the end portion and the central portion, respectively.

7. A manufacturing method of a semiconductor device comprising:
    dry-etching a semiconductor substrate, or an insulating interlayer structure or a gate electrode material formed on the semiconductor substrate, wherein etching residue material is left on the etched surface;
    supplying a solution onto the semiconductor substrate; measuring a specific resistance or a conductivity of the supplied solution; and
    determining a puddle time for accumulating a removal solution on a surface of the semiconductor substrate on the basis of the specific resistance or the conductivity of the supplied solution, the removal solution removing an etching residual material adhering to the semiconductor substrate or the structure during the dry-etching;

determining a relative temperature between the semiconductor substrate and the removal solution on the basis of a coarseness/denseness of surface patterns of the semiconductor substrate; and supplying the removal solution, which has a temperature different from the semiconductor substrate by the relative temperature, on the semiconductor substrate, and accumulating the removal solution on the semiconductor substrate for the puddle time, when the etching residual material is removed.

8. The method of manufacturing a semiconductor device according to claim 7, wherein when the specific resistance or the conductivity of the supplied solution increases as a density of surface patterns of the semiconductor substrate or a density of surface patterns of the structure are low, a temperature of the semiconductor substrate is set to be lower than a temperature of the removal solution; and when the specific resistance or the conductivity of the supplied solution decreases as the density of the surface patterns of the semiconductor substrate or the density of the surface patterns of the structure are low, the temperature of the semiconductor substrate is set to be higher than the temperature of the removal solution.

9. A manufacturing method of a semiconductor device comprising:

dry-etching a semiconductor substrate, or an insulating interlayer structure or a gate electrode material formed on the semiconductor substrate, wherein etching residue material is left on the etched surface;

supplying a solution, which has an oxidation-reduction potential of 0.5 V or less, on the semiconductor substrate or the structure, to which an etching residual material adheres;

removing the etching residual material by supplying the removal solution onto the semiconductor substrate or the structure.

10. The manufacturing method of a semiconductor device according to claim 9, wherein the supplied solution includes any one of a solution including any one of a hydrochloric acid, a chloric acid, a hypochlorous acid, a chlorous acid, a perchloric acid, a hydrofluoric acid, a hydro cyanic acid, a carbonic acid, hydrogencarbonate, a sulfuric acid, a sulfurous acid, nitric acid, a nitrous acid, a phosphoric acid, a formic acid, an oxalic acid, an acetic acid, a citric acid, a maleic acid, a malonic acid, an oleic acid, a tartaric acid, or a glyoxylic acid.

11. The manufacturing method of a semiconductor device according to claim 9, wherein the supplied solution is a pure water or a solution in which at least any one of HCl gas, HF gas, CO gas, $CO_2$ gas, NO gas, $NO_2$ gas, $SO_2$ gas, $SO_3$ gas dissolve.

* * * * *